United States Patent
Muramatsu et al.

(10) Patent No.: US 6,468,841 B2
(45) Date of Patent: Oct. 22, 2002

(54) PROCESS FOR PRODUCING CRYSTALLINE SILICON THIN FILM

(75) Inventors: Shinichi Muramatsu, Tokyo; Harunori Sakaguchi, Tsuchiura; Susumu Takahashi, Abiko, all of (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 09/829,450

(22) Filed: Apr. 10, 2001

(65) Prior Publication Data

US 2001/0039103 A1 Nov. 8, 2001

(30) Foreign Application Priority Data

Apr. 10, 2000 (JP) ......................................... 2000-108437

(51) Int. Cl.[7] .......................... H01L 21/00; H01L 21/84; H01L 21/04
(52) U.S. Cl. ........................ 438/150; 438/455; 438/458; 438/160; 438/486; 438/151; 438/143; 438/149
(58) Field of Search .................... 438/149, 150, 438/455, 458, 478–509, 379–399, 584, 141, 151, 166, 787, 758, 763, 788, 637, 773, 692, 143

(56) References Cited

U.S. PATENT DOCUMENTS

| 6,156,627 | A | * | 12/2000 | Zhang et al. | ................ 438/486 |
| 6,165,824 | A | * | 12/2000 | Takano et al. | ................ 438/160 |
| 6,221,738 | B1 | * | 4/2001 | Sakaguchi et al. | ................ 438/455 |
| 6,326,280 | B1 | * | 12/2001 | Tayanaka | ................ 438/22 |
| 6,331,208 | B1 | * | 12/2001 | Nishida et al. | ................ 117/89 |
| 6,337,231 | B1 | * | 1/2002 | Zhang et al. | ................ 438/150 |

FOREIGN PATENT DOCUMENTS

| JP | 40521846 A | * | 8/1993 | ................ 136/243 |
| JP | 05-283722 | | 10/1993 | |
| JP | 10-079330 | | 3/1998 | |

* cited by examiner

*Primary Examiner*—Caridad Everhart
*Assistant Examiner*—Victor Yevsikov
(74) *Attorney, Agent, or Firm*—Foley & Lardner

(57) ABSTRACT

At least a part of the surface of a crystalline silicon semiconductor substrate is rendered porous to convert at least a part of the crystalline silicon semiconductor substrate to a porous silicon layer. A catalytic metal layer is formed on the porous silicon layer. An amorphous silicon thin film is formed on the catalytic metal layer. The amorphous silicon thin film is heated to monocrystallize the amorphous silicon thin film, thereby converting the amorphous silicon thin film to a crystalline silicon thin film. The crystalline silicon semiconductor substrate, provided with the crystalline silicon thin film, is joined to a support substrate so that the crystalline silicon thin film faces the support substrate. The crystalline silicon semiconductor substrate, together with the porous silicon layer, which is the crystalline silicon semiconductor substrate in its portion converted to a porous layer, is separated and removed from the crystalline silicon thin film joined to the support substrate. By virtue of the above constitution, a process for producing a crystalline silicon thin film can be realized which enables, for example, the temperature required in the production process of a crystalline silicon thin film to be lowered to improve the quality of the crystalline silicon thin film, can realize close control of a steep dopant concentration gradient and the like, and can produce a crystalline silicon thin film suitable for an increase in fabrication density and a reduction in layer thickness of semiconductor devices.

20 Claims, 5 Drawing Sheets

FIG. 1(a)

↓ HEATING TREATMENT

FIG. 1(b)

↓ JOINING

FIG. 1(c)

↓ SEPARATION

4 CATALYTIC METAL LAYER
5a AMORPHOUS SILICON-CONTAINING LAYER
1 CRYSTALLINE SILICON SEMICONDUCTOR SUBSTRATE

↓ HEATING TREATMENT

FIG.2(b)

5b CRYSTALLINE SILICON THIN FILM
2 POROUS SILICON LAYER

7 SUPPORT SUBSTRATE

↓ JOINING

FIG.2(c)

↓ SEPARATION

- 34 Ni LAYER
- 33a AMORPHOUS SILICON-CONTAINING LAYER
- 32a
- 32b
- 31 P-TYPE MONOCRYSTALLINE SILICON SEMICONDUCTOR SUBSTRATE

↓ HEATING TREATMENT

FIG.5(b)

- 33b CRYSTALLINE SILICON THIN FILM
- 32a
- 32b
- 31
- 37 QUARTZ SUBSTRATE

↓ JOINING

FIG.5(c)

- 37
- 33b
- 32a POROUS LAYER WITH SMALLER-DIAMETER PORES
- 32b POROUS LAYER WITH LARGER-DIAMETER PORES
- 31

↓ SEPARATION

PROCESS FOR PRODUCING CRYSTALLINE SILICON THIN FILM

FIELD OF THE INVENTION

The invention relates to a process for producing a crystalline silicon thin film (layer). More particularly, the invention relates to a process for producing a crystalline silicon thin film, which enables, for example, the temperature required in the production process of a crystalline silicon thin film to be lowered to keep the quality of the crystalline silicon thin film, can realize close control of a steep dopant concentration gradient and the like, and can produce a crystalline silicon thin film suitable for an increase in fabrication density and a reduction in layer thickness of semiconductor devices.

BACKGROUND OF THE INVENTION

A crystalline silicon thin film formed on a dissimilar substrate such as glass (this structure being called SOI (silicon-on-insulator)) has many advantageous properties, such as easy separation between semiconductor devices, higher integration density, lower power consumption, and higher speed.

A conventional production process of this type of crystalline silicon thin film comprises the steps of: anodically converting the surface of a crystalline silicon semiconductor substrate to a porous silicon layer; forming a crystalline silicon thin film on the porous silicon layer by epitaxial growth; and finally separating and removing the crystalline silicon semiconductor substrate, together with the porous silicon layer that is the crystalline silicon semiconductor substrate in its portion which has been rendered porous, from the crystalline silicon thin film joined to a support substrate (Japanese Patent No. 2962918 and Japanese Patent Laid-open No. 79330/1998). This production process has the following advantage. In this production process, a porous silicon layer, of which the pore diameter can be easily regulated by anodic conversion conditions, is used as a release layer. Therefore, a multi-layer structure comprising a plurality of layers having different functions (for example, a porous layer having smaller-diameter pores as an epitaxially grown adherent layer and a porous layer having larger-diameter pores as a release layer) can be easily formed, and this enables the crystalline silicon thin film to be simply and surely produced.

Since, however, a monocrystalline silicon thin film is formed by epitaxial growth which requires a high-temperature atmosphere of about 1000° C., this production process poses problems including that the film quality lowers with increasing the fabrication density of semiconductor devices and reducing the film thickness and, further, it is difficult to closely regulate a steep dopant concentration gradient and the like.

SUMMARY OF THE INVENTION

Accordingly, it is an object of the invention to provide a process for producing a crystalline silicon thin film, which enables, for example, the temperature required in the production process of a crystalline silicon thin film to be lowered to improve the quality of the crystalline silicon thin film, can realize close control of a steep dopant concentration gradient and the like, and can produce a crystalline silicon thin film suitable for an increase in fabrication density and a reduction in layer thickness of semiconductor devices.

The above object can be attained by the following production processes of a crystalline silicon thin film.

[1] A process for producing a crystalline silicon thin film, comprising the steps of:

rendering at least a part of the surface of a crystalline silicon semiconductor substrate porous to convert at least a part of the surface of the crystalline silicon semiconductor substrate to a porous silicon layer;

forming a catalytic metal layer on the porous silicon layer;

forming an amorphous silicon thin film on the catalytic metal layer;

heating the amorphous silicon thin film to monocrystallize the amorphous silicon thin film, thereby converting the amorphous silicon thin film to a crystalline silicon thin film;

joining the crystalline silicon semiconductor substrate, provided with the crystalline silicon thin film, to a support substrate so that the crystalline silicon thin film faces the support substrate; and separating and removing the crystalline silicon semiconductor substrate, together with the porous silicon layer, which is the crystalline silicon semiconductor substrate in its portion converted to a porous layer, from the crystalline silicon thin film joined to the support substrate.

[2] The process according to the above item [1], wherein the porous silicon layer comprises two or more porous layers having different pore diameters and the porous layer having a larger pore diameter is used as a release layer for separating the crystalline silicon semiconductor substrate from crystalline silicon thin film.

[3] The process according to the above item [1] or [2], wherein the porous silicon layer is formed by anodic conversion.

[4] The process according to any one of the above items [1] to [3], wherein the amorphous silicon thin film is an n- or p-conductivity type layer such that the conductivity type and/or concentration profile are varied in the thicknesswise direction of the layer.

[5] The process according to any one of the above items [1] to [4], wherein the crystalline silicon thin film is joined to the support substrate by anodic joining.

[6] The process according to any one of the above items [1] to [5], wherein an insulating layer is formed on any one of the crystalline silicon thin film and the support substrate and the crystalline silicon thin film is joined to the support substrate through the insulating layer.

[7] The process according to any one of the above items [1] to [6], wherein the catalytic metal layer comprises at least one element selected from the group consisting of nickel, iron, cobalt, platinum, copper, and gold, either as a simple substance or as a compound thereof.

[8] The process according to any one of the above items [1] to [7], wherein the catalytic metal layer has a multi-layer structure comprising an adherent metal layer and a reactive metal layer.

[9] The process according to the above item [8], wherein the adherent metal layer comprises at least one element selected from the group consisting of titanium, chromium, molybdenum, tungsten, and tantalum, either as a simple substance or as a compound thereof.

[10] The process according to the above item [8] or [9], wherein the reactive metal layer comprises at least one element selected from the group consisting of nickel, iron, cobalt, platinum, copper, and gold, either as a simple substance or as a compound thereof.

[11] A process for producing a crystalline silicon thin film, comprising the steps of:

rendering at least a part of the surface of a crystalline silicon semiconductor substrate porous to convert at least a part of the surface of the crystalline silicon semiconductor substrate to a porous silicon layer;

introducing amorphous silicon into pores of the porous silicon layer at least on its surface side to form an amorphous silicon-containing layer:

forming a catalytic metal layer on the amorphous silicon-containing layer:

heating the amorphous silicon contained in the amorphous silicon-containing layer to monocrystallize the amorphous silicon, thereby converting the amorphous silicon-containing layer to a crystalline silicon thin film;

joining the crystalline silicon semiconductor substrate, provided with the crystalline silicon thin film, to a support substrate so that the crystalline silicon thin film faces the support substrate; and separating and removing the crystalline silicon semiconductor substrate, together with the porous silicon layer, which is the crystalline silicon semiconductor substrate in its portion converted to a porous layer, from the crystalline silicon thin film joined to the support substrate.

[12] The process according to the above item [11], wherein the porous silicon layer comprises two or more porous layers having different pore diameters and the porous layer having a larger pore diameter is used as a release layer for separating the crystalline silicon semiconductor substrate from crystalline silicon thin film.

[13] The process according to the above item [11] or [12], wherein the porous silicon layer is formed by anodic conversion.

[14] The process according to any one of the above items [11] to [13], wherein the amorphous silicon thin film is an n- or p-conductivity type layer such that the conductivity type and/or concentration profile are varied in the thicknesswise direction of the layer.

[15] The process according to any one of the above items [11] to [14], wherein the crystalline silicon thin film is joined to the support substrate by anodic joining.

[16] The process according to any one of the above items [11] to [15] wherein an insulating layer is formed on any one of the crystalline silicon thin film and the support substrate and the crystalline silicon thin film is joined to the support substrate through the insulating layer.

[17] The process according to any one of the above items [11] to [16], wherein the catalytic metal layer comprises at least one element selected from the group consisting of nickel, iron, cobalt, platinum, copper, and gold, either as a simple substance or as a compound thereof.

[18] The process according to any one of the above items [11] to [17], wherein the catalytic metal layer has a multi-layer structure comprising an adherent metal layer and a reactive metal layer.

[19] The process according to the above item [18], wherein the adherent metal layer comprises at least one element selected from the group consisting of titanium, chromium, molybdenum, tungsten, and tantalum, either as a simple substance or as a compound thereof.

[20] The process according to the above item [18] or [19], wherein the reactive metal layer comprises at least one element selected from the group consisting of nickel, iron, cobalt, platinum, copper, and gold, either as a simple substance or as a compound thereof.

BRIEF DESCRIPTION OF THE DRAWINGS

The invention will be explained in more detail in conjunction with the appended drawings, wherein:

FIG. 1 is a typical cross-sectional view illustrating production steps constituting a first preferred embodiment of the process for producing a crystalline silicon thin film according to the invention;

FIG. 2 is a typical cross-sectional view illustrating production steps constituting a second preferred embodiment of the process for producing a crystalline silicon thin film according to the invention;

FIG. 3 is a typical cross-sectional view illustrating one example of the process for producing a crystalline silicon thin film according to the invention;

FIG. 4 is a typical cross-sectional view illustrating another example of the process for producing a crystalline silicon thin film according to the invention; and FIG. 5 is a typical cross-sectional view illustrating a further example of the process for producing a crystalline silicon thin film according to the invention.

DESCRIPTION OF THE PREFERRED EMBODIMENTS

Preferred embodiments of the invention will be explained in detail in conjunction with the accompanying drawings.

As shown in FIG. 1, the production process of a crystalline silicon thin film according to one preferred embodiment of the invention comprises the steps of: rendering at least a part of the surface of a crystalline silicon semiconductor substrate 1 porous to convert at least a part of the surface of the crystalline silicon semiconductor substrate 1 to a porous silicon layer 2; forming a catalytic metal layer 4 on the porous silicon layer 2; forming an amorphous silicon thin film 3a on the catalytic metal layer 4; heating the amorphous silicon thin film 3a to monocrystallize the amorphous silicon thin film 3a, thereby converting the amorphous silicon thin film 3a to a crystalline silicon thin film 3b; joining the crystalline silicon semiconductor substrate 1, provided with the crystalline silicon thin film 3b, to a support substrate 7 so that the crystalline silicon thin film 3b faces the support substrate 7; and separating and removing the crystalline silicon semiconductor substrate 1, together with the porous silicon layer 2, which is the crystalline silicon semiconductor substrate 1 in its portion converted to a porous layer, from the crystalline silicon thin film 3b joined to the support substrate 7 (this production process is hereinafter sometimes referred to as "first production process").

Further, as shown in FIG. 2, the production process of a crystalline silicon thin film according to another preferred embodiment of the invention comprises the steps of: rendering at least a part of the surface of a crystalline silicon semiconductor substrate 1 porous to convert at least a part of the surface of the crystalline silicon semiconductor substrate 1 to a porous silicon layer 2; introducing amorphous silicon into pores of the porous silicon layer 2 at least on its surface side to form an amorphous silicon-containing layer 5a; forming a catalytic metal layer 4 on the amorphous silicon-containing layer 5a; heating the amorphous silicon contained in the amorphous silicon-containing layer 5a to monocrystallize the amorphous silicon, thereby converting the amorphous silicon-containing layer 5a to a crystalline silicon thin film 5b; joining the crystalline silicon semiconductor substrate 1. provided with the crystalline silicon thin film 5b, to a support substrate 7 so that the crystalline silicon thin film 5b faces the support substrate 7; and separating and removing the crystalline silicon semiconductor substrate 1, together with the porous silicon layer 2, which is the crystalline silicon semiconductor substrate 1 in its portion converted to a porous layer, from the crystalline silicon thin film 5b joined to the support substrate 7 (this production process is hereinafter sometimes referred to as "second production process").

The preferred embodiments of the invention will be explained in more detail.

1. First Production Process

As shown in step (a) in FIG. 1, according to the first production process, at least a part of the surface of a crystalline silicon semiconductor substrate 1 is first rendered porous and thus is converted to a porous silicon layer 2.

Materials for the crystalline silicon semiconductor substrate 1 include, for example, n-type or p-type monocrystalline silicon and polycrystalline silicon.

Any method may be used without particular limitation to render at least a part of the surface of the crystalline silicon semiconductor substrate 1, and an example of a suitable method is anodic conversion.

The anodic conversion may be carried out, for example, using a hydrofluoric acid-ethanol solution.

The porous silicon layer 2 preferably comprises two or more porous layers having different pore diameters and the porous layer having a larger pore diameter is used as a release layer for separating the crystalline silicon semiconductor substrate from crystalline silicon thin film.

This can enhance the adhesion of the porous silicon layer 2 to the catalytic metal layer 4 and, at the same time, can make it easy to separate the crystalline silicon semiconductor substrate 1 from the crystalline silicon thin film.

The two or more porous layer having different pore diameters may be formed, for example, by a method wherein, in the anodic conversion, a porous layer having a smaller pore diameter is first formed at low current density followed by the formation of a porous layer having a larger pore diameter at high current density.

The porous silicon layer 2 is not particularly limited. Preferably, however, the porous silicon layer 2 in its surface on the catalytic metal layer 4 side is flattened from the viewpoint of improving the adhesion to the catalytic metal layer 4 which will be described later in detail.

The flattening may be achieved, for example, by hydrogenation under predetermined conditions (for example, at 1050° C. for 30 min).

In the first production process, the catalytic metal layer 4 is then formed on the porous silicon layer 2.

The presence of the catalytic metal layer 4 can accelerate the crystallization of an amorphous silicon thin film 3a described below and thus can realize the formation of a crystalline silicon thin film 3b at a very low temperature.

The catalytic metal layer 4 is not particularly limited. Preferably, however, the catalytic metal layer 4 comprises at least one element selected from the group consisting of nickel, iron, cobalt, platinum, copper, and gold, either as a simple substance or as a compound thereof. Examples of compounds thereof include NiSi.

Preferably, the catalytic metal layer 4 comprises two or more layers including an adherent metal layer and a reactive metal layer. This construction can improve the adhesion of the catalytic metal layer 4 to the porous layer to prevent the catalytic metal layer 4 from being separated upon heat treatment.

The adherent metal layer is not particularly limited. Preferably, however, the adherent metal layer comprises at least one element selected from the group consisting of titanium, chromium, molybdenum, tungsten, and tantalum, either as a simple substance or as a compound thereof. The reactive metal layer also is not particularly limited. Preferably, however, the reactive metal layer comprises at least one element selected from the group consisting of nickel, iron, cobalt, platinum, copper, and gold, either as a simple substance or as a compound thereof.

Methods for forming the catalytic metal layer 4 include, for example, vapor deposition, metal vapor growth, metal liquid phase growth, and spin coating of a metal salt solution.

In the first production process, an amorphous silicon thin film 3a is then formed on the catalytic metal layer 4.

Materials for the formation of the amorphous silicon thin film 3a are not particularly limited, and include, for example, a mixed gas composed of $H_2$, $SiH_4$ and a dopant such as $B_2H_6$ or $PH_3$.

The amorphous silicon thin film 3a may be formed by any method so far as impurities are not introduced, and examples of methods usable herein include vapor deposition, P-CVD, CVD, and sputtering.

The amorphous silicon thin film 3a is preferably an n- or p-conductivity type layer such that the conductivity type and/or concentration profile are varied in the thicknesswise direction of the layer.

This construction can realize close regulation of a steep dopant concentration gradient in the thicknesswise direction in the finally formed crystalline silicon thin film 3b.

Varying the conductivity type in the thicknesswise direction of the film may be achieved, for example, by a method which comprises the steps of: forming an amorphous silicon thin film, for example, by P-CVD, using a mixed gas containing either n- or p-conductivity type dopant; and, then, in a reaction chamber different from the reaction chamber used in the above step, further forming the amorphous silicon thin film, for example, by P-CVD, using a mixed gas containing a dopant of a conductivity type different from the dopant used in the above step.

The concentration profile may be varied, for example, by a method which comprises the steps of; forming an amorphous silicon thin film, for example, by P-CVD, using a mixed gas containing a dopant at a higher concentration; and, then, in a reaction chamber different from the reaction chamber used in the above step, further forming the amorphous silicon thin film, for example, by P-CVD, using a mixed gas containing a dopant at a lower concentration.

The silicon contained in the formed amorphous silicon thin film 3a is preferably amorphous from the viewpoint of facilitating crystallization upon heat treatment. Alternatively, the silicon contained in the formed amorphous silicon thin film 3a may be in a fine crystal form so far as the particle diameter is not more than 10 nm.

As shown in step (b) in FIG. 1, in the first production process, the amorphous silicon thin film 3a is then heat treated to monocrystallize the amorphous silicon thin film 3a, whereby amorphous silicon thin film 3a is converted to a crystalline silicon thin film 3b.

The heat treatment temperature is preferably 400 to 750° C., more preferably 450 to 700° C., particularly preferably 500 to 600° C.

The heat treatment may be carried out, for example, in a nitrogen atmosphere, a vacuum atmosphere, an argon atmosphere, a halide atmosphere, or a hydrogen gas atmosphere. Among others, heat treatment in a hydrogen gas atmosphere at a very low pressure (for example, 0.5 Torr) is preferred. This can reduce the content of hydrogen in the amorphous silicon thin film 3a and, in addition, can weaken the adhesion of the porous silicon layer by virtue of the diffusion of hydrogen into the porous silicon layer.

In the heat treatment, the catalytic metal migrates onto the surface of the crystalline silicon thin film 3b and hardly stays in the thin film. The catalytic metal, which has migrated on the surface of the crystalline silicon thin film 3b, can be completely removed, for example, by surface oxidation with nitric acid, aqueous ozone or the like, and/or by the removal of silicon dioxide with hydrofluoric acid. Further, a very low amount of the catalytic metal remaining in the thin film can be diffused and segregated into the porous silicon layer 2 by subsequent additional heat treatment.

Therefore, in the crystalline silicon thin film 3b formed according to the invention, the concentration of the catalytic metal in the thin film can be reduced to a detection limit in the secondary ion mass spectroscopy (SIMS), and, thus, a high-quality crystalline silicon thin film can be realized.

As shown in step (c) in FIG. 1, in the first production process, the crystalline silicon semiconductor substrate 1 provided with the crystalline silicon thin film 3b is then joined to a support substrate 7 so that the crystalline silicon thin film 3b faces the support substrate 7.

Any material may be used as the support substrate 7 so far as the material can withstand subsequent heat treatment, and examples thereof include glass, ceramics, metallic silicon, polycrystalline silicon, tungsten, quartz, and sapphire.

Joining may be carried out by any method without particular limitation, and examples of methods usable herein include anodic joining and heat joining. Among others, anodic joining is preferred from the viewpoint of lowering the temperature required in the production process.

Further, from the viewpoint of improving the joining property, a method is preferred wherein an insulating layer is formed on either the crystalline silicon thin film 3b or the support substrate 7 and the crystalline silicon thin film 3b is joined to the support substrate 7 through the insulating layer.

The insulating layer may be formed, for example, by a method wherein silicon is oxidized by thermal oxidation.

As shown in step (d) in FIG. 1, in the first production process, finally, the crystalline silicon semiconductor substrate 1, together with the porous silicon layer 2 which is the crystalline silicon semiconductor substrate 1 in its portion converted to a porous layer, is separated and removed from the crystalline silicon thin film 3b joined to the support substrate 7.

The separation may be carried out by any method without particular limitation, and separation methods usable herein include: a method wherein stress is applied to mechanically separate the crystalline silicon semiconductor substrate through the porous silicon layer having mechanically low strength and the remaining porous silicon layer is removed with an etching solution; a method wherein grinding is performed from the crystalline silicon semiconductor substrate side until the porous silicon layer is removed and the remaining porous silicon layer is removed with an etching solution; a method wherein through-holes extended from the crystalline silicon semiconductor substrate side to the porous silicon layer are provided and an etching solution is allowed to penetrate through the through-holes to selectively remove and separate the porous silicon layer.

Etching solutions usable for removing the porous silicon layer include, for example, a mixed solution composed of hydrofluoric acid, aqueous hydrogen peroxide, and water.

According to the invention, a crystalline silicon thin film 3b on silicon dioxide can be provided via these steps. The crystalline silicon thin film 3b thus obtained can be polished to reduce the film thickness and to provide a mirror surface for use, for example, in SOI substrates and solar cells.

2. Second Production Process

As shown in step (a) in FIG. 2, in the second production process, at the outset, the procedure of the first production process is repeated to render at least a part of the surface of a crystalline silicon semiconductor substrate 1 porous to convert at least a part of the surface of the crystalline silicon semiconductor substrate 1 to a porous silicon layer 2.

In the second production process, amorphous silicon is then introduced into pores of the porous silicon layer 2 at least on its surface side to form an amorphous silicon-containing layer 5a.

The amorphous silicon-containing layer 5a may be formed in the same manner as used in the formation of the amorphous silicon thin film 3a in the first production process.

As shown in steps (b) to (d) in FIG. 2, in the second production process, a catalytic metal layer 4 is then formed on the amorphous silicon-containing layer 5a. The amorphous silicon contained in the amorphous silicon-containing layer 5a is heated to monocrystallize the amorphous silicon, thereby converting the amorphous silicon-containing layer 5a to a crystalline silicon thin film 5b. The crystalline silicon semiconductor substrate 1 provided with the crystalline silicon thin film 5b is joined to a support substrate 7 so that the crystalline silicon thin film 5b faces the support substrate 7. The crystalline silicon semiconductor substrate 1, together with the porous silicon layer 2 which is the crystalline silicon semiconductor substrate 1 in its portion converted to a porous layer, is separated and removed from the crystalline silicon thin film 5b joined to the support substrate 7.

These steps in the second production process may be carried out in the same manner as in the first production process.

EXAMPLES

The following examples further illustrate but do not limit the invention.

Example 1

As shown in step (a) in FIG. 3, a monocrystalline silicon semiconductor substrate 11 having a specific resistance of 0.01 Ωcm was subjected to anodic conversion in a hydrofluoric acid-ethanol solution (hydrofluoric acid:ethanol=1:1) to convert the surface of the monocrystalline silicon semiconductor substrate 11 to an 8.5 μm-thick porous silicon layer 12. The anodic conversion was carried out at a low current density to bring the diameter of particles and the diameter of pores in the porous silicon layer 12 to not more than 10 μm.

Next, hydrogenation was carried out at a substrate temperature of 1050° C. for 30 min to bring the surface of the porous silicon layer 12 to a flattened surface 13 through rearrangement on an atomic level.

A 1 nm-thick nickel layer 14 was then formed as a metallic catalyst layer by vapor deposition on the surface of the porous silicon layer 12.

A mixed gas composed of H, $SiH_4$, and $B_2H_6$ was then introduced into the system, and a 300 nm-thick p-type amorphous silicon thin film 15a was then formed on the nickel layer 14 by P-CVD under conditions of pressure 0.3 Torr, substrate temperature 200° C., and frequency of 13.56 MHz.

As shown in step (b) in FIG. 3, heat treatment was then carried out in a nitrogen atmosphere at a temperature of 550° C. to convert the p-type amorphous silicon thin film 15a to a p-type crystalline silicon thin film 15b. In this case, the presence of the nickel layer accelerated the crystallization and, in addition, improved the crystallinity.

Diffused nickel was present in a segregated state on the surface of the p-type crystalline silicon thin film 15b. This diffused nickel was removed by surface etching with hydrofluoric acid, followed by wet thermal oxidation at 900° C. to form 70 nm-thick silicon dioxide 16. Upon this heat treatment, nickel present in a very small amount in the crystalline silicon thin film 15b also was diffused and segregated in the porous silicon layer 12.

Next, as shown in step (c) in FIG. 3, a monocrystalline silicon semiconductor substrate 17 having a specific resistance of 5 Ωcm was provided as a support substrate, and was brought into intimate contact with the silicon dioxide 16 formed on the surface of the crystalline silicon thin film 5b, and a positive voltage was applied to the monocrystalline silicon semiconductor substrate 17 side under heating at 300° C., whereby the crystalline silicon thin film 5b in the crystalline silicon semiconductor substrate 11 provided with the crystalline silicon thin film 5b was joined to the monocrystalline silicon semiconductor substrate 17 through the silicon dioxide 16.

Next, as shown in step (d) in FIG. 3, grinding was carried out from the backside of the monocrystalline silicon semiconductor substrate 11 until the porous silicon layer 12 was exposed. Thus, the crystalline silicon thin film 15b joined to the support substrate 17 was separated from the crystalline silicon semiconductor substrate 11. The porous silicon layer 12 remaining on the crystalline silicon thin film 15b was removed by etching with a mixed solution composed of hydrofluoric acid, aqueous hydrogen peroxide, and water.

Finally, the crystalline silicon thin film 15b was polished to reduce the thickness to 150 nm and to provide a mirror surface. Thus, an SOI substrate was completed.

Example 2

Figure 1A:
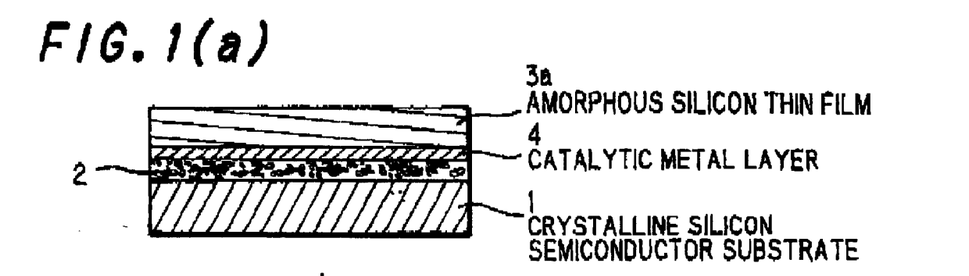
Figure 1B:
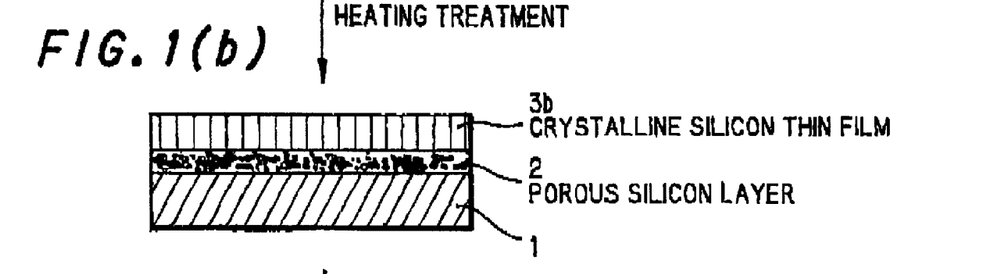
Figure 1C:
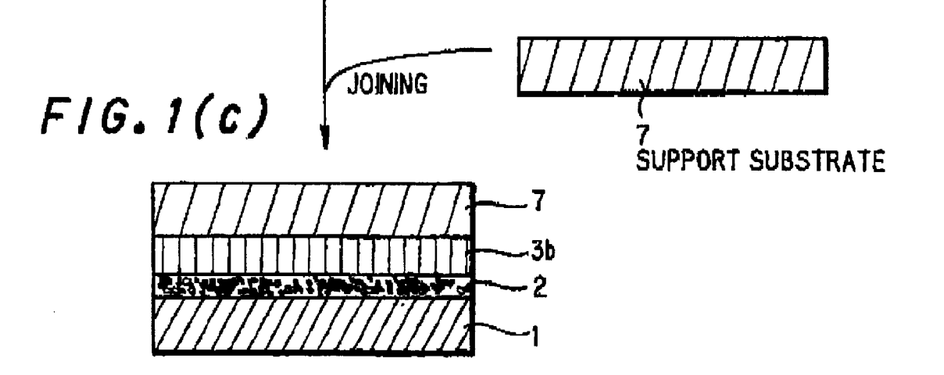
Figure 1D:
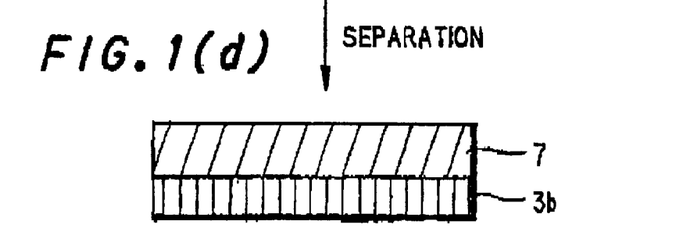
Figure 2A:
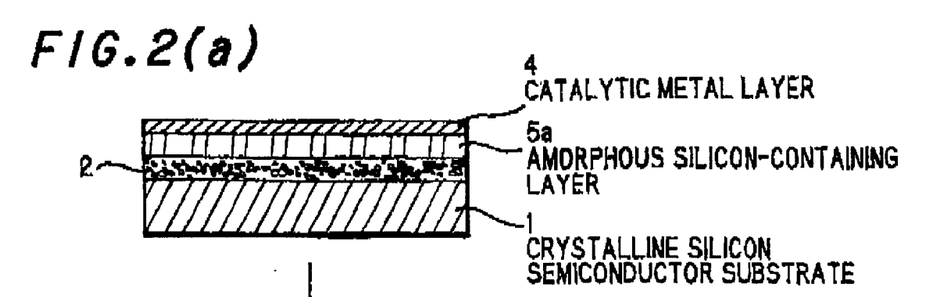
Figure 2B:
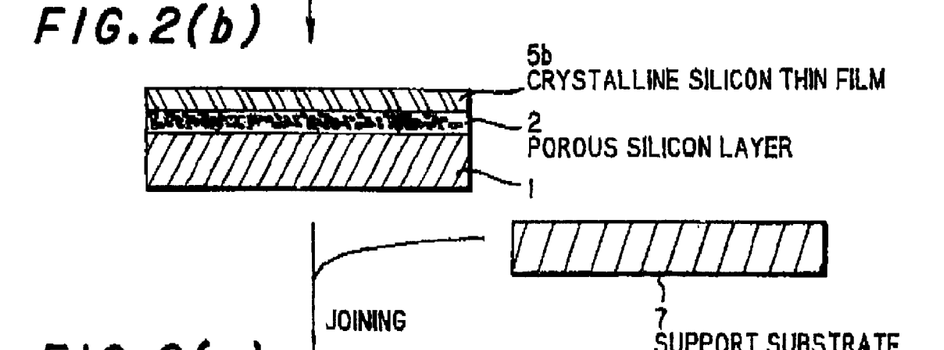
Figure 2C:
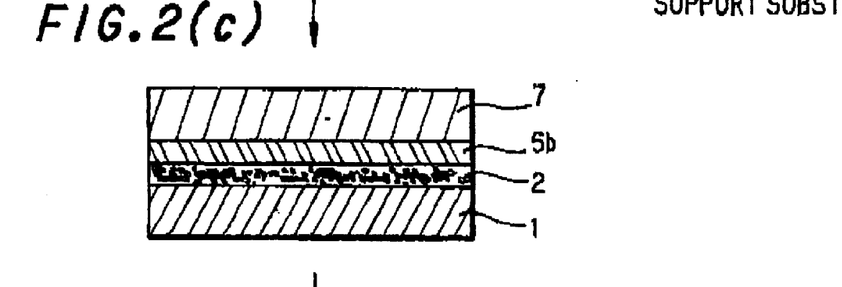
Figure 2D:
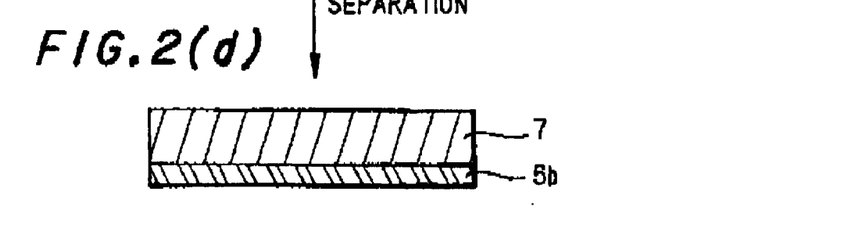
Figure 3A:
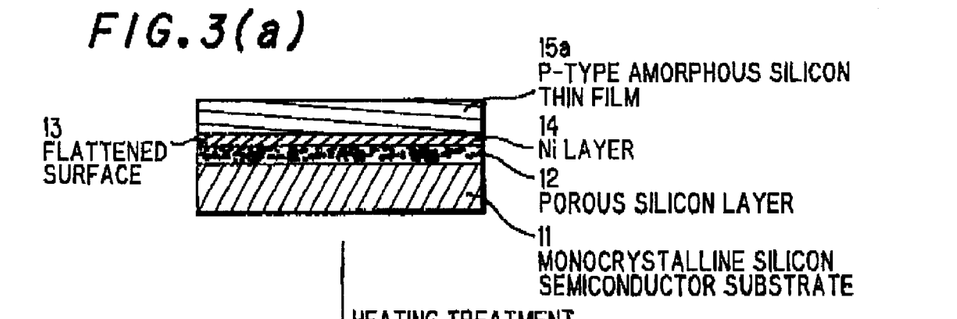
Figure 3B:
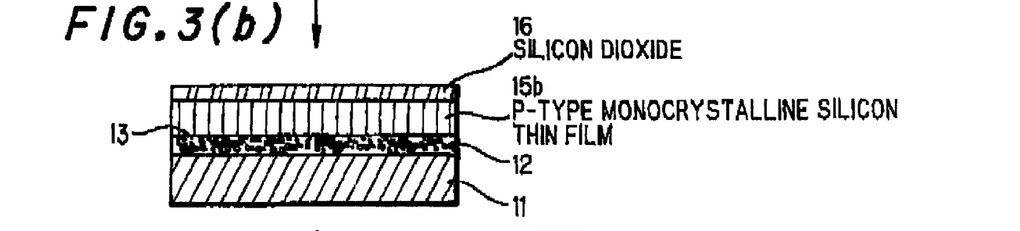
Figure 3C:
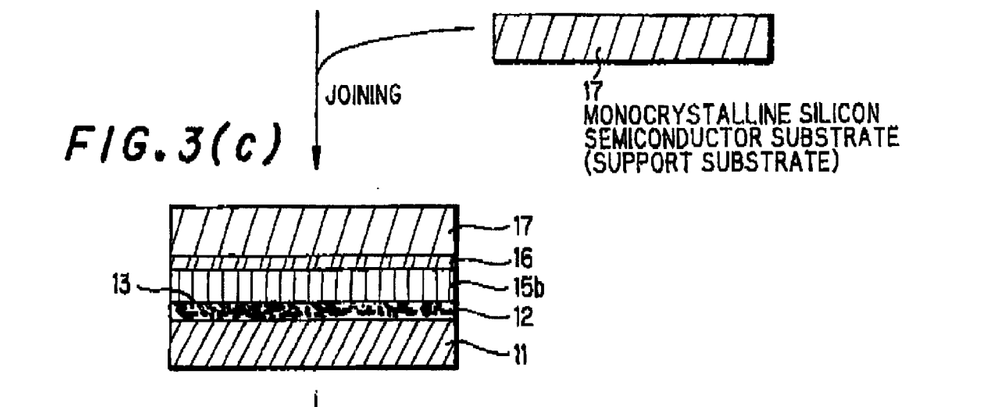
Figure 3D:
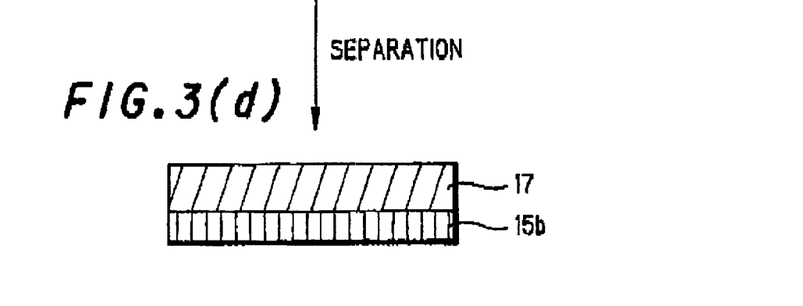
Figures 4A, 4B, 4C, 4D:
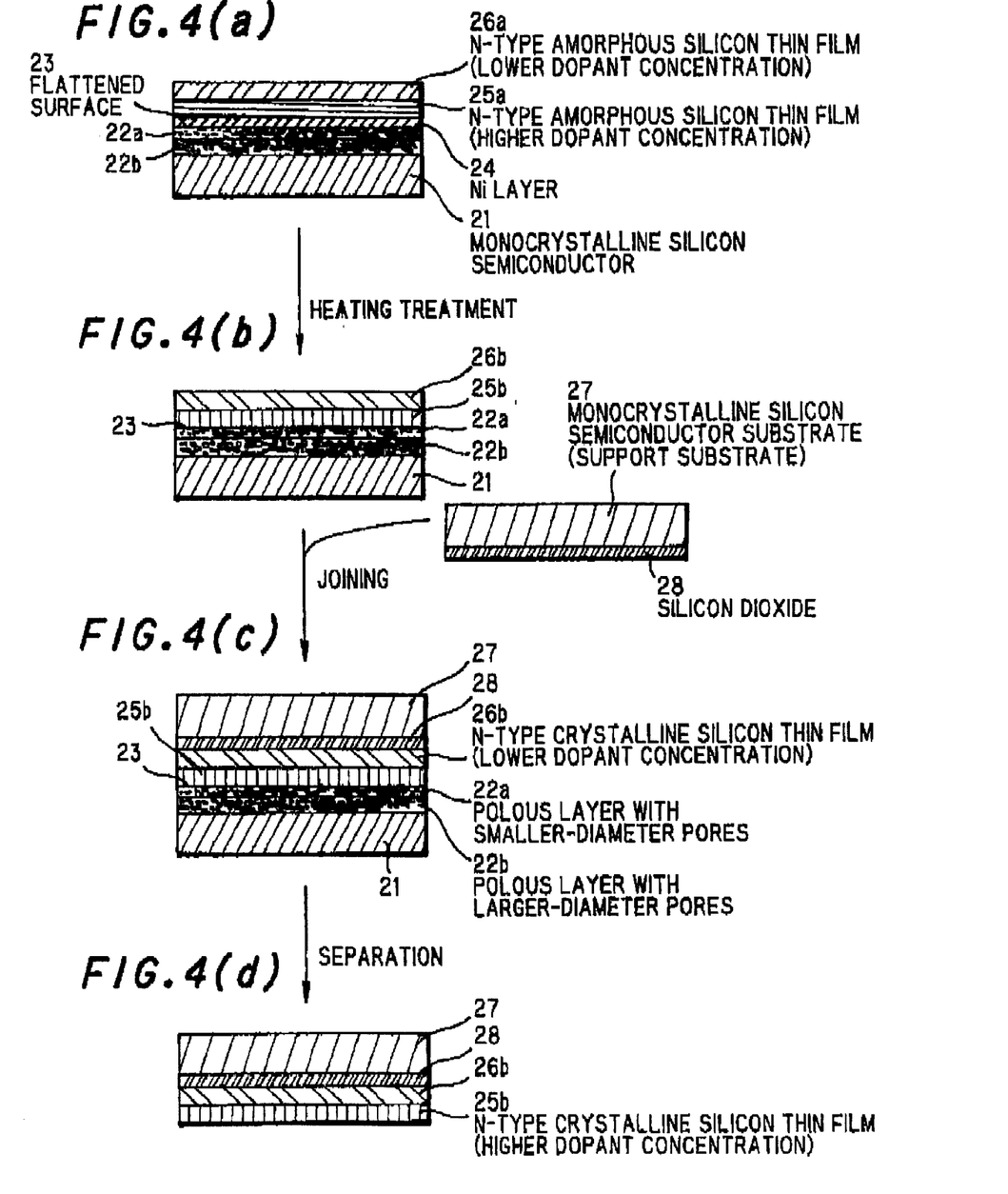
Figure 5A:
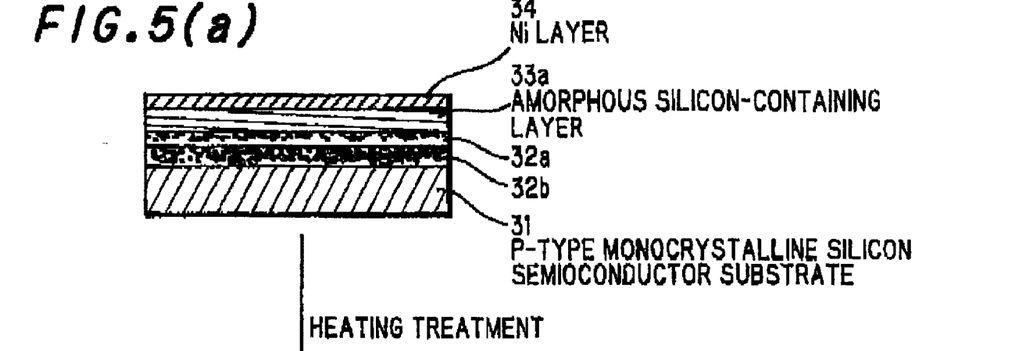
Figure 5B:
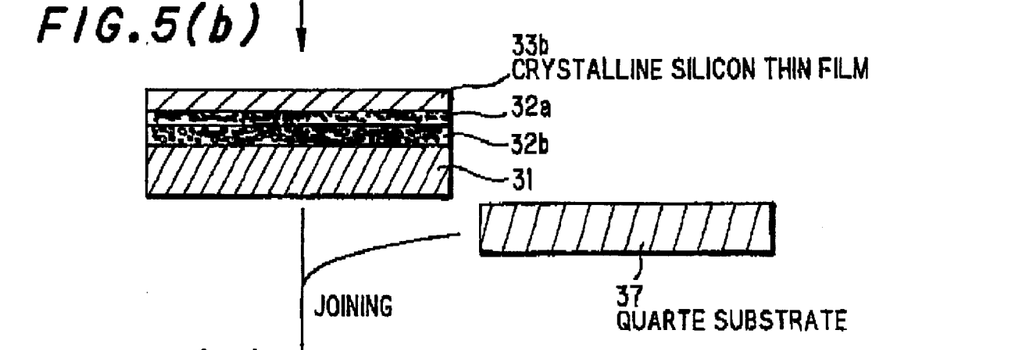
Figure 5C:
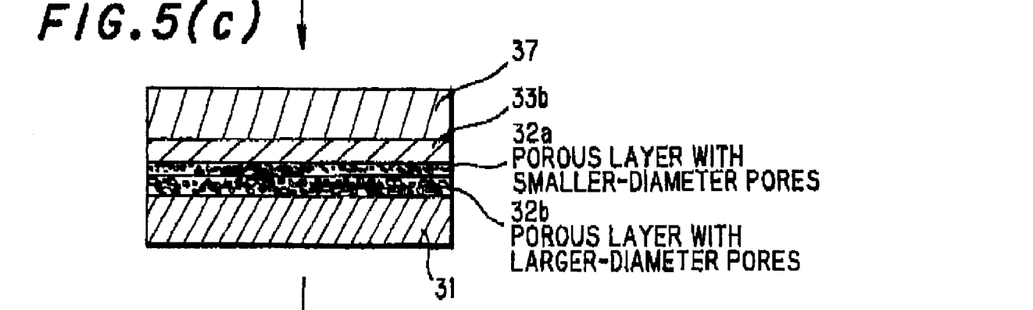
Figure 5D:
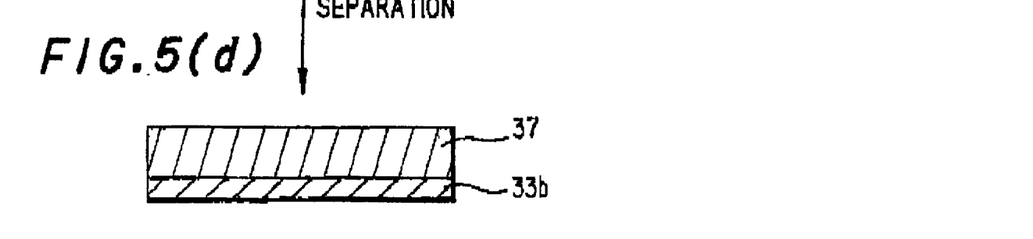

As shown in step (a) in FIG. 4, a monocrystalline silicon semiconductor substrate 21 having a specific resistance of 0.01 Ωcm was subjected to anodic conversion in a hydrofluoric acid-ethanol solution (hydrofluoric acid:ethanol=1:1) to convert the surface of the monocrystalline silicon semiconductor substrate 21 to a porous silicon layer 22.

In this case, the anodic conversion was first carried out at a low current density to form a porous layer 22a having a smaller pore diameter, and was then carried out at a high current density which was 50 times higher than the current density used in the formation of the porous layer 22a. Thus, a porous layer 22b having a larger pore diameter was formed under the porous layer 22a having a smaller pore diameter.

Next, hydrogenation was carried out at a substrate temperature of 1050° C. for 30 min to bring the surface of the porous silicon layer 22a having a smaller pore diameter to a flattened surface 23.

A 1 nm-thick nickel layer 24 was then formed as a metallic catalyst layer by metal vapor growth on the surface of the porous silicon layer.

A mixed gas composed of $H_2$, $SiH_4$, and 10 ppm of $PH_3$ was then introduced into the system, and a 150 nm-thick n-type amorphous silicon thin film 25a having a higher dopant concentration was then formed on the nickel layer 24 by P-CVD under conditions of pressure 0.3 Torr, substrate temperature 250° C., and frequency of 40 MHz. Further, in a reaction chamber different from the reaction chamber used in the above P-CVD, a mixed gas composed of $H_2$, $SiH_4$, and 0.2 ppm of $PH_3$ was introduced into the system, and a 50 nm-thick n-type amorphous silicon thin film 26a having a lower dopant concentration was then formed by P-CVD under conditions of pressure 0.3 Torr, substrate temperature 250° C., and frequency 13.56 MHz.

Next, as shown in step (b) in FIG. 4, heat treatment was carried out in a hydrogen gas atmosphere having pressure of 0.5 Torr at a substrate temperature of 420° C., and was then carried out at a substrate temperature of 550° C. to form n-type crystalline silicone thin films 25b, 26b having a steep dopant concentration gradient.

In these heat treatments, nickel migrated onto the surface of the n-type crystalline silicon thin film 25b and hardly stayed within the layer. The nickel, which had migrated onto the surface, was completely removed by surface oxidation with nitric acid or aqueous ozone and by the removal of the silicon dioxide with hydrofluoric acid. Further, nickel remaining within the layer was diffused and segregated into the porous silicon layer 22 by heat treatment at a temperature of 850° C. for 30 min. Thus, the concentration of nickel in the n-type crystalline silicon thin film 25b was reduced to not more than $10^{16}/cm^3$.

Next, as shown in step (c) in FIG. 4, a monocrystalline silicon semiconductor substrate 27 having a specific resistance of 5 Ωcm was provided as a support substrate, and silicon dioxide 28 was then formed on the surface of the monocrystalline silicon semiconductor substrate 27. The silicon dioxide 28 was brought into intimate contact with the n-type crystalline silicon thin film 26b. In this state, a positive voltage was applied to the monocrystalline silicon semiconductor substrate 27 aside under heating at 300° C., whereby the n-type crystalline silicon thin films 25b, 26b in the crystalline silicon semiconductor substrate 21 provided with the n-type crystalline silicon thin films 25b, 26b were joined to the monocrystlaline silicon semiconductor substrate 27 through the silicon dioxide 28.

Next, as shown in step (d) in FIG. 4, stress was applied to separate, through the porous silicon layer 22b, having a larger pore diameter, with lower mechanical strength, the crystalline silicon semiconductor substrate 21 together with the porous silicon layer 22 (22a, 22b) from the n-type crystalline silicon thin films 25b, 26b joined to the monocrystalline silicon semiconductor substrate 27. The porous silicon layer 22 (22a, 22b) remaining on the n-type crystalline silicon thin film 26b was then removed by etching with a mixed solution composed of hydrofluoric acid, aqueous hydrogen peroxide, and water.

Finally, the crystalline silicon thin films 25b, 26b were etched to reduce the thickness to 100 nm and to provide a mirror surface. Thus, an SOI substrate was completed.

Example 3

As shown in step (a) in FIG. 5, a p-type monocrystalline silicon semiconductor substrate 31 having a specific resistance 0.1 Ωcm was subjected to anodic conversion in a hydrofluoric acid-ethanol solution (hydrofluoric acid:ethanol=1:1) to convert the surface of the p-type monocrystalline silicon semiconductor substrate 31 to a porous silicon layer 32.

In this case, the anodic conversion was first carried out at a low current density to form a porous layer 32a having a smaller pore diameter in the p-type monocrystalline silicon semiconductor substrate 31 in its surface, and was then carried out at a high current density which was 50 times higher than the current density used in the formation of the porous layer 32a. Thus, a porous layer 32b having a larger pore diameter was formed under the porous layer 32a having a smaller pore diameter.

Next, p-type amorphous silicon was introduced by P-CVD using a mixed gas composed of $H_2$, $SiH_4$, and $B_2H_6$ under conditions of pressure 2 Torr, substrate temperature 400° C., and frequency 13.56 MHz.

In this case, the amorphous silicon was introduced into the pores in the porous silicon layer rather than the surface of the porous silicon layer 32 and was hardly deposited on the surface. The depth of the amorphous silicon introduced into the porous silicon layer was 100 nm, and, thus, a 100 nm-thick amorphous silicon-containing layer 33a was formed.

A 1 nm-thick nickel layer 34 was then formed as a catalytic metal layer by vapor deposition.

Thereafter, heat treatment was carried out in hydrogen gas under conditions of pressure 0.5 Torr and substrate temperature 600° C. to convert the amorphous silicon-containing layer 33a to a crystalline silicon thin film 33b. This heat treatment caused the diffusion and segregation of nickel into the porous silicon layer to reduce the concentration of nickel in the crystalline silicon thin film 33b to not more than $10^{15}/cm^3$.

As shown in step (c) in FIG. 5, a high-purity quartz substrate 37 was then provided as a support substrate, and was brought into intimate contact with the surface of the crystalline silicon thin film 33b. In this state, a positive voltage was applied to the quartz substrate 37 side under heating at 300° C., whereby the crystalline silicon thin film 33b in the crystalline silicon semiconductor substrate 31 provided with the crystalline silicon thin film 33b was joined to the quartz substrate 37.

Next, as shown in step (d) in FIG. 5, stress was applied to separate, through the porous silicon layer 32b, having a larger pore diameter, with lower mechanical strength, the crystalline silicon semiconductor substrate 31 together with the porous silicon layer 32 (32a, 32b) from the crystalline silicon thin film 33b joined to the quartz substrate 37. The porous silicon layer 32 (32a, 32b) remaining on the crystalline silicon thin film 33b was then removed by etching with a mixed solution composed of hydrofluoric acid, aqueous hydrogen peroxide, and water.

Finally, the crystalline silicon thin film 33b was etched to reduce the thickness to 80 nm and to provide a mirror surface. Thus, an SOI substrate was completed.

As described above, the process for producing a crystalline silicon thin film according to the invention enables, for example, the temperature required in the production process of a crystalline silicon thin film to be lowered to improve the quality of the crystalline silicon thin film, can realize close control of a steep dopant concentration gradient and the like, and can produce a crystalline silicon thin film suitable for an increase in fabrication density and a reduction in layer thickness of semiconductor devices.

The invention has been described in detail with particular reference to preferred embodiments, but it will be understood that variations and modifications can be effected within the scope of the invention as set forth in the appended claims.

What is claimed is:

1. A process for producing a crystalline silicon thin film, comprising the steps of:
    rendering at least a part of the surface of a crystalline silicon semiconductor substrate porous to convert at least a part of the surface of the crystalline silicon semiconductor substrate to a porous silicon layer;
    forming a catalytic metal layer on the porous silicon layer;
    forming an amorphous silicon thin film on the catalytic metal layer;
    heating the amorphous silicon thin film to monocrystallize the amorphous silicon thin film, thereby converting the amorphous silicon thin film to a crystalline silicon thin film;
    joining the crystalline silicon semiconductor substrate, provided with the crystalline silicon thin film, to a support substrate so that the crystalline silicon thin film faces the support substrate; and
    separating and removing the crystalline silicon semiconductor substrate, together with the porous silicon layer, which is the crystalline silicon semiconductor substrate in its portion converted to a porous layer, from the crystalline silicon thin film joined to the support substrate.

2. The process according to claim 1, wherein the porous silicon layer comprises two or more porous layers having different pore diameters and the porous layer having a larger pore diameter is used as a release layer for separating the crystalline silicon semiconductor substrate from crystalline silicon thin film.

3. The process according to claim 1, wherein the porous silicon layer is formed by anodic conversion.

4. The process according to claim 1, wherein the amorphous silicon thin film is an n- or p-conductivity type layer such that the conductivity type and/or concentration profile are varied in the thicknesswise direction of the layer.

5. The process according to claim 1, wherein the crystalline silicon thin film is joined to the support substrate by anodic joining.

6. The process according to claim 1, wherein an insulating layer is formed on any one of the crystalline silicon thin film and the support substrate and the crystalline silicon thin film is joined to the support substrate through the insulating layer.

7. The process according to claim 1, wherein the catalytic metal layer comprises at least one element selected from the group consisting of nickel, iron, cobalt, platinum, copper, and gold, either as a simple substance or as a compound thereof.

8. The process according to claim 1, wherein the catalytic metal layer has a multi-layer structure comprising an adherent metal layer and a reactive metal layer.

9. The process according to claim 8, wherein the adherent metal layer comprises at least one element selected from the group consisting of titanium, chromium, molybdenum, tungsten, and tantalum, either as a simple substance or as a compound thereof.

10. The process according to claim 8, wherein the reactive metal layer comprises at least one element selected from the group consisting of nickel, iron, cobalt, platinum, copper, and gold, either as a simple substance or as a compound thereof.

11. A process for producing a crystalline silicon thin film, comprising the steps of:
    rendering at least a part of the surface of a crystalline silicon semiconductor substrate porous to convert at least a part of the surface of the crystalline silicon semiconductor substrate to a porous silicon layer;
    introducing amorphous silicon into pores of the porous silicon layer at least on its surface side to form an amorphous silicon-containing layer;
    forming a catalytic metal layer on the amorphous silicon-containing layer;
    heating the amorphous silicon contained in the amorphous silicon-containing layer to monocrystallize the amorphous silicon, thereby converting the amorphous silicon-containing layer to a crystalline silicon thin film;

joining the crystalline silicon semiconductor substrate, provided with the crystalline silicon thin film, to a support substrate so that the crystalline silicon thin film faces the support substrate; and separating and removing the crystalline silicon semiconductor substrate, together with the porous silicon layer, which is the crystalline silicon semiconductor substrate in its portion converted to a porous layer, from the crystalline silicon thin film joined to the support substrate.

12. The process according to claim 11, wherein the porous silicon layer comprises two or more porous layers having different pore diameters and the porous layer having a larger pore diameter is used as a release layer for separating the crystalline silicon semiconductor substrate from crystalline silicon thin film.

13. The process according to claim 11, wherein the porous silicon layer is formed by anodic conversion.

14. The process according to claim 11, wherein the amorphous silicon thin film is an n- or p- conductivity type layer such that the conductivity type and/or concentration profile are varied in the thicknesswise direction of the layer.

15. The process according to claim 11, wherein the crystalline silicon thin film is joined to the support substrate by anodic joining.

16. The process according to claim 11, wherein an insulating layer is formed on any one of the crystalline silicon thin film and the support substrate and the crystalline silicon thin film is joined to the support substrate through the insulating layer.

17. The process according to claim 11, wherein the catalytic metal layer comprises at least one element selected from the group consisting of nickel, iron, cobalt, platinum, copper, and gold, either as a simple substance or as a compound thereof.

18. The process according to claim 11, wherein the catalytic metal layer has a multi-layer structure comprising an adherent metal layer and a reactive metal layer.

19. The process according to claim 18, wherein the adherent metal layer comprises at least one element selected from the group consisting of titanium, chromium, molybdenum, tungsten, and tantalum, either as a simple substance or as a compound thereof.

20. The process according to claim 18, wherein the reactive metal layer comprises at least one element selected from the group consisting of nickel, iron, cobalt, platinum, copper, and gold, either as a simple substance or as a compound thereof.

* * * * *